United States Patent
Yao et al.

(10) Patent No.: US 9,857,208 B2
(45) Date of Patent: Jan. 2, 2018

(54) MEASUREMENT DEVICE

(71) Applicant: YOKOGAWA ELECTRIC CORPORATION, Tokyo (JP)

(72) Inventors: Mariko Yao, Tokyo (JP); Masakazu Hori, Tokyo (JP); Kazuhiro Shimizu, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 372 days.

(21) Appl. No.: 14/642,854

(22) Filed: Mar. 10, 2015

(65) Prior Publication Data

US 2015/0260552 A1 Sep. 17, 2015

(30) Foreign Application Priority Data

Mar. 14, 2014 (JP) ................................. 2014-051557

(51) Int. Cl.
| | |
|---|---|
| *G01D 18/00* | (2006.01) |
| *G01R 31/00* | (2006.01) |
| *H03M 1/10* | (2006.01) |

(52) U.S. Cl.
CPC ........... *G01D 18/00* (2013.01); *G01R 31/005* (2013.01); *H03M 1/1038* (2013.01)

(58) Field of Classification Search
CPC .... G01D 18/00; G01R 31/005; G01R 31/316; H03M 1/1038; H03M 1/10; G09G 3/10;
(Continued)

(56) References Cited

U.S. PATENT DOCUMENTS

| | | | | |
|---|---|---|---|---|
| 4,896,282 A | * | 1/1990 | Orwell | G01R 35/005 341/120 |
| 2007/0182377 A1 | * | 8/2007 | Vandensande | G01R 31/3658 320/132 |

(Continued)

FOREIGN PATENT DOCUMENTS

| | | |
|---|---|---|
| GB | 2199711 A | 7/1988 |
| JP | 08-189940 A | 7/1996 |

(Continued)

*Primary Examiner* — Eric Ward
*Assistant Examiner* — Eric Ashbahian
(74) *Attorney, Agent, or Firm* — Sughrue Mion, PLLC

(57) ABSTRACT

A measurement device according to one aspect of the present invention includes a first controller configured to output a control signal and a second controller configured to perform a first control and then to perform a second control based on the control signal output from the first controller. The control signal designates both an input signal and a calibration signal to be converted into a digital input signal and a digital calibration signal, respectively. The input signal is input from an outside of the measurement device. The calibration signal is previously prepared. The first control is for selecting the input signal and converting the selected input signal into the digital input signal. The second control is for selecting the calibration signal and converting the selected calibration signal into the digital calibration signal and for calculating a measured value using the digital input signal converted by the first control and another digital calibration signal converted by a control performed before the first control.

16 Claims, 4 Drawing Sheets

(58) Field of Classification Search
CPC . G09G 3/00; G09G 3/36; G06F 19/00; H05B 41/38
See application file for complete search history.

(56) References Cited

U.S. PATENT DOCUMENTS

| | | | |
|---|---|---|---|
| 2011/0276294 A1* | 11/2011 | Ota | G01R 35/005 702/85 |
| 2013/0185012 A1 | 7/2013 | Yamamoto et al. | |
| 2013/0191053 A1* | 7/2013 | Spanier | G01R 22/10 702/60 |

FOREIGN PATENT DOCUMENTS

| | | |
|---|---|---|
| JP | 2011-220698 A | 11/2011 |
| JP | 2013-142648 A | 7/2013 |

\* cited by examiner

MEASUREMENT DEVICE

BACKGROUND OF THE INVENTION

Field of the Invention

The present invention relates to a measurement device.

Priority is claimed on Japanese Patent Application No. 2014-051557, filed on Mar. 14, 2014, the contents of which are incorporated herein by reference.

Description of Related Art

A measurement device generally includes a sensor configured to detect a physical quantity (e.g., temperature, pressure, flow rate, or the like) and a signal processor configured to process a detected signal detected by the sensor. The signal processor converts the detected signal obtained from the sensor into a digital signal and performs a predetermined calculation processing for the digital signal to measure a physical quantity. Such a measurement device includes a device configured to measure a physical quantity while performing internal calibration to prevent degradation of measurement accuracy due to a measurement error. The measurement error is caused by aging or the like.

In particular, the measurement device capable of performing internal calibration sequentially converts a detected signal obtained from the sensor and a calibration signal previously prepared into a digital detected signal and a digital calibration signal, respectively. Then, the measurement device performs a predetermined calculation processing using the digital detected signal and the digital calibration signal to correct a measurement error and to measure a physical quantity with a high degree of accuracy. The above-described calibration signal is for calibrating a zero-point (e.g., a lower limit in a signal range), a span (e.g., a difference between an upper limit and a lower limit in a signal range), or the like, or for indicating internal terminal temperature or the like. Such a measurement device is provided in, for example, a field device used in an instrumentation system, various recorders (for example, a paperless recorder and a chart recorder), a data logger, or the like.

Japanese Patent Application Laid-Open Publication No. 2011-220698 (hereinafter, referred to as "PTL1") discloses a multipoint switching measurement device capable of measuring analog signals of a plurality of channels while performing the above-described internal calibration. In particular, the multipoint switching measurement device disclosed in PTL 1 shortens the update cycle of a specific channel measurement, while increasing an update cycle of another channel measurement. Thereby, the multipoint switching measurement device enables the measurements of all channels.

The above-described measurement device capable of performing internal calibration includes a main controller configured to integrally control operations of the measurement device. The main controller sequentially performs a control for converting a detected signal obtained from the sensor into a digital signal and a control for converting a calibration signal into a digital signal. Therefore, the measurement device in the related art sequentially and repeatedly performs a first process for converting a detected signal obtained from the sensor into a digital signal based on instructions of the main controller, a second process for converting a calibration signal into a digital signal based on instruction of the main controller, a third process for calculating measured results using the digital signals obtained by the first and second processes. In other words, the measurement cycle in the measurement device in the related art is from a time when the above-described first process is started to a time when the third process is completed and the main controller obtains the calculation results of the third process.

Recently, an increase in the speed of a measurement device is in demand, thus, shortening of a measurement cycle is desired. Since the above-described measurement device in the related art sequentially performs the above-described first to third processes by sequentially performing the control for converting a detected signal obtained from the sensor into a digital signal and the control for converting a calibration signal into a digital signal using the main controller, there are some cases where the shortening of the measurement cycle is difficult. In addition, the above-described measurement device in the related art is required to perform both the control for converting a detected signal obtained from the sensor into a digital signal and the control for converting a calibration signal into a digital signal in the measurement cycle. In other words, the above-described measurement device in the related art is required to perform the communication with regard to a control signal twice in the measurement cycle. This contributes to an increase in the measurement cycle.

SUMMARY OF THE INVENTION

One aspect of the present invention provides a measurement device capable of shortening the measurement cycle.

A measurement device according to one aspect of the present invention may include a first controller configured to output a control signal and a second controller configured to perform a first control and then to perform a second control based on the control signal output from the first controller. The control signal may designate both an input signal and a calibration signal to be converted into a digital input signal and a digital calibration signal, respectively. The input signal may be input from an outside of the measurement device. The calibration signal may be previously prepared. The first control may be for selecting the input signal and converting the selected input signal into the digital input signal. The second control may be for selecting the calibration signal and converting the selected calibration signal into the digital calibration signal and for calculating a measured value using the digital input signal converted by the first control and another digital calibration signal converted by a control performed before the first control.

In the above-described measurement device, a plurality of calibration signals may be previously prepared. The control signal output from the first controller may designate both the input signal and one of the plurality of calibration signals.

In the above-described measurement device, the second controller may include a selector configured to select the input signal and one of the calibration signals, a converter configured to convert the input signal and the one of the calibration signals selected by the selector into the digital input signal and the digital calibration signal, respectively, a calculator configured to calculate the measured value using the digital input signal and the digital calibration signal converted by the converter, and a manager configured to control the selector and the converter to perform the first control and to control the selector, the converter, and the calculator to perform the second control based on the control signal output from the first controller.

In the above-described measurement device, the calculator may be configured to transitorily memorize the digital calibration signal converted by the second control and to use the memorized digital calibration signal in a control after the second control.

In the above-described measurement device, the measurement device may include a plurality of second controllers. The first controller may be configured to simultaneously output the control signal to the plurality of second controllers.

In the above-described measurement device, the second controller may further include a first storage storing the calibration signal.

In the above-described measurement device, the second controller may further include a transmitter configured to transmit the measured value calculated by the calculator to the first controller.

In the above-described measurement device, the converter may be configured to output a conversion completion signal to the manager each time the converter converts the signal selected by the selector into the digital signal.

In the above-described measurement device, the calculator may further include a second storage storing the digital calibration signal converted by the converter.

In the above-described measurement device, the calculator may be configured to calculate the measured value using a latest digital input signal output from the converter and the digital calibration signal stored in the second storage.

In the above-described measurement device, the calculator may be configured to calculate the measured value using a latest digital input signal output from the converter and a latest digital calibration signal among digital calibration signals stored in the second storage.

In the above-described measurement device, the second controller may further include a receiver configured to receive the control signal output from the first controller.

In the above-described measurement device, the receiver may be configured to output, to the manager, the control signal received from the first controller.

In the above-described measurement device, the second controller may be configured to perform the conversion of the calibration signal into the digital calibration signal and the calculation of the measured value in parallel.

In the above-described measurement device, each of the plurality of second controllers may be configured to perform the first control and then to perform the second control based on the control signal simultaneously output from the first controller to each of the second controllers.

According to one aspect of the present invention, the main controller inputs, into the sub controller, a control signal designating both an input signal and a calibration signal, which are to be converted into a digital input signal and a digital calibration signal, respectively, and the sub controller performs the first control and then performs the second control, based on the control signal output from the main controller. Therefore, the present invention can shorten the measurement cycle.

DETAILED DESCRIPTION OF THE INVENTION

Hereinafter, some embodiments of the present invention will be described in detail with reference to the drawings.

First Embodiment

Figure 1:
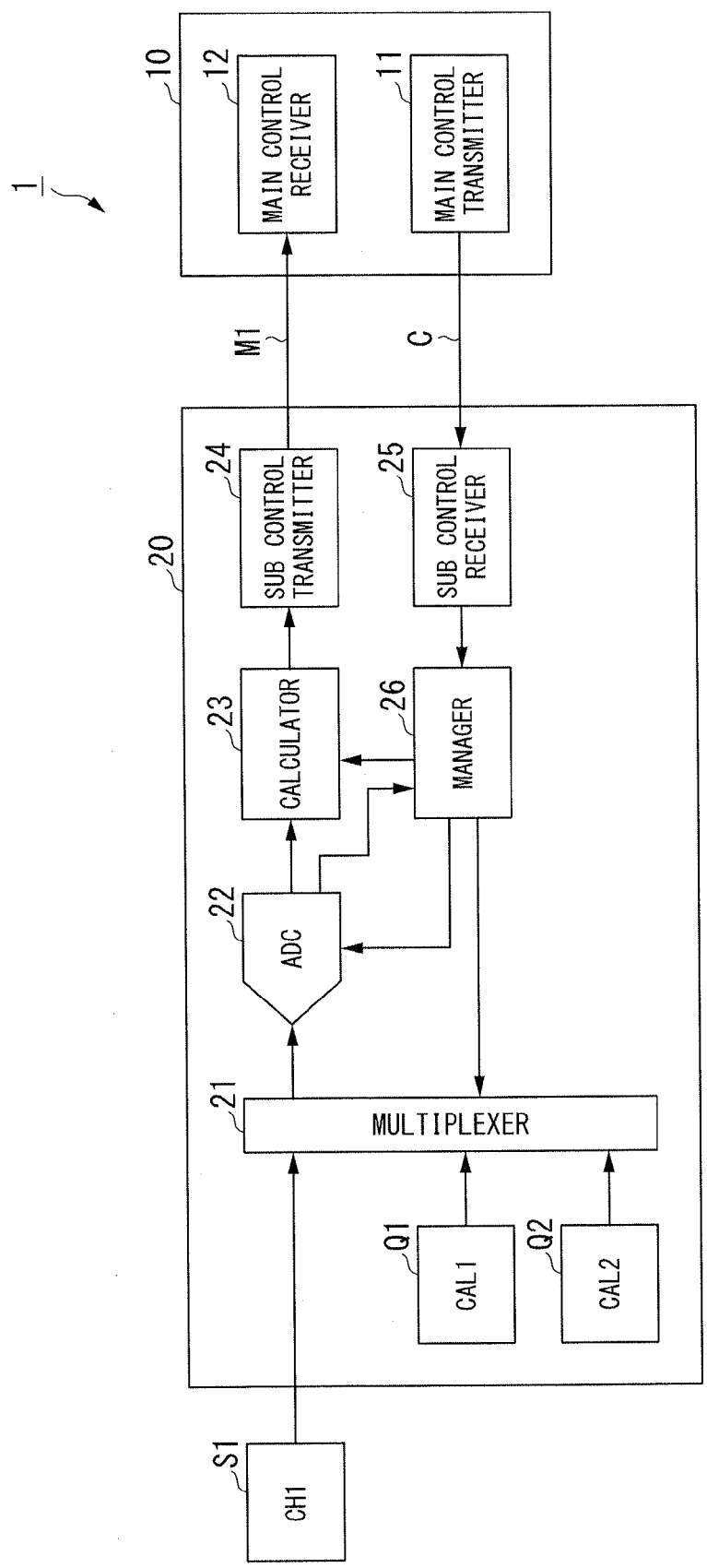
FIG. 1 is a block diagram showing the main parts of the configuration of a measurement device according to a first embodiment of the present invention.

FIG. 1 is a block diagram showing the main parts of the configuration of a measurement device according to a first embodiment of the present invention. As shown in FIG. 1, a measurement device 1 according to the first embodiment includes a main controller 10 (first controller) and a sub controller 20 (second controller). The measurement device 1 converts a measured signal S1 (input signal) input from the outside of the measurement device 1 and a previously prepared internal calibration signal Q1 or Q2 (calibration signal) into a digital measured signal S1 and a digital internal calibration signal Q1 or Q2, respectively. Then, the measurement device 1 calculates a measured value M1 using these data, which have been converted into the digital signals. Such a measurement device 1 is provided in, for example, a field device used in an instrumentation system, various recorders, a data logger, or the like.

The above-described measured signal S1 indicates a measured result, which is a physical quantity (e.g., temperature, pressure, flow rate, or the like), and is output from, for example, a sensor configured to measure a physical quantity (not shown). The above-described internal calibration signals Q1 and Q2 are for calibrating a zero-point, a span, or the like, or for indicating internal terminal temperature or the like. These internal calibration signals Q1 and Q2 are previously stored into a storage (first storage) (not shown) provided in, for example, the sub controller 20. Hereinafter, the measured signal S1 is sometimes referred to as a "measured signal CH1", and the internal calibration signals Q1 and Q2 are sometimes referred to as "internal calibration signals CAL1 and CAL2".

The main controller 10 integrally controls the operations of the measurement device 1. In particular, the main controller 10 includes a main control transmitter 11 and a main control receiver 12. The main controller 10 obtains the above-mentioned measured value M1 by controlling the sub controller 20. The main controller 10 is implemented by, for example, a central processing unit (CPU).

The main control transmitter 11 transmits, to the sub controller 20, a control signal C for controlling the sub controller 20. The control signal C designates the measured signal S1 and the internal calibration signals Q1 and Q2 to be converted in a digital signal. In particular, as shown in FIG. 1, when the two internal calibration signals Q1 and Q2 are prepared in the sub controller 20, the control signal C designates both the measured signal S1 and the internal calibration signal Q1 or designates both the measured signal S1 and the internal calibration signal Q2.

In the first embodiment, using the control signal C designating both the measured signal S1 and one of the internal calibration signals Q1 and Q2, the number of communications between the main controller 10 and the sub controller 20 (the number of communications of the control signal C) is reduced to shorten the measurement cycle. The main control receiver 12 receives the measured value M1 transmitted from the sub controller 20.

The sub controller 20 calculates the measured value M1 using the input measured signal S1 and transmits the calculated measured value M1 to the main controller 10 under the control of the main controller 10. The sub controller 20 includes a multiplexer 21 (selector), an analog-to-digital converter (ADC) 22 (converter), a calculator 23, a sub control transmitter 24 (transmitter), a sub control receiver 25 (receiver), and a manager 26. Similar to the main controller 10, the sub controller 20 is implemented by, for example, a central processing unit (CPU).

The multiplexer 21 receives the measured signal S1 and the internal calibration signals Q1 and Q2 as the input, selects and outputs the measured signal S1 and one of the internal calibration signals Q1 and Q2 under the control of the manager 26. The ADC 22 converts the signal selected by the multiplexer 21 into a digital signal under the control of the manager 26. The ADC 22 outputs a conversion completion signal to the manager 26 each time the ADC 22 completes the conversion process.

The calculator 23 calculates the measured value M1 by performing a predetermined calculation using the digital signal output from the ADC 22 under the control of the manager 26. In particular, the calculator 23 includes a memory (second storage) (not shown) transitorily storing the digital signal output from the ADC 22 (the digitalized internal calibration signals Q1 and Q2). The calculator 23 calculates the measured value M1 using the latest digital signal output from the ADC 22 (the digitalized measured signal S1) and the digital signal stored in the memory under the control of the manager 26.

The sub control transmitter 24 transmits, to the main controller 10 (main control receiver 12), the measured value M1 calculated by the calculator 23. The sub control receiver 25 receives the control signal C transmitted from the main controller 10 (main control transmitter 11) and outputs the received control signal C to the manager 26.

The manager 26 makes the multiplexer 21, the ADC 22, and the calculator 23 calculate the measured value M1 by controlling them based on the control signal C output from the sub control receiver 25. In particular, the manager 26 makes the multiplexer 21, the ADC 22, and the calculator 23 sequentially perform the following two controls (first control and second control) to calculate the measured value M1 each time the sub control receiver 25 outputs the control signal C.

(1) A control for controlling the multiplexer 21 to allow the multiplexer 21 to select the measured signal S1 and for controlling the ADC 22 to allow the ADC 22 to convert the selected measured signal S1 into a digital signal (first control)

(2) A control for controlling the multiplexer 21 to allow the multiplexer 21 to select one of the internal calibration signals Q1 and Q2, for controlling the ADC 22 to allow the ADC 22 to convert the selected internal calibration signal into a digital signal, and for controlling the calculator 23 to allow the calculator 23 to calculate the measured value M1 (second control)

In the control of the above-described (2), the calculator 23 controls the ADC 22 and the calculator 23 so that a conversion process of the internal calibration signal selected by the multiplexer 21 into a digital signal and a calculation process of the measured value M1 are performed in parallel. As described above, in the first embodiment, by performing the conversion process of the internal calibration signal into the digital signal and the calculation process of the measured value M1 in parallel, the measurement cycle is shortened.

Figure 2:
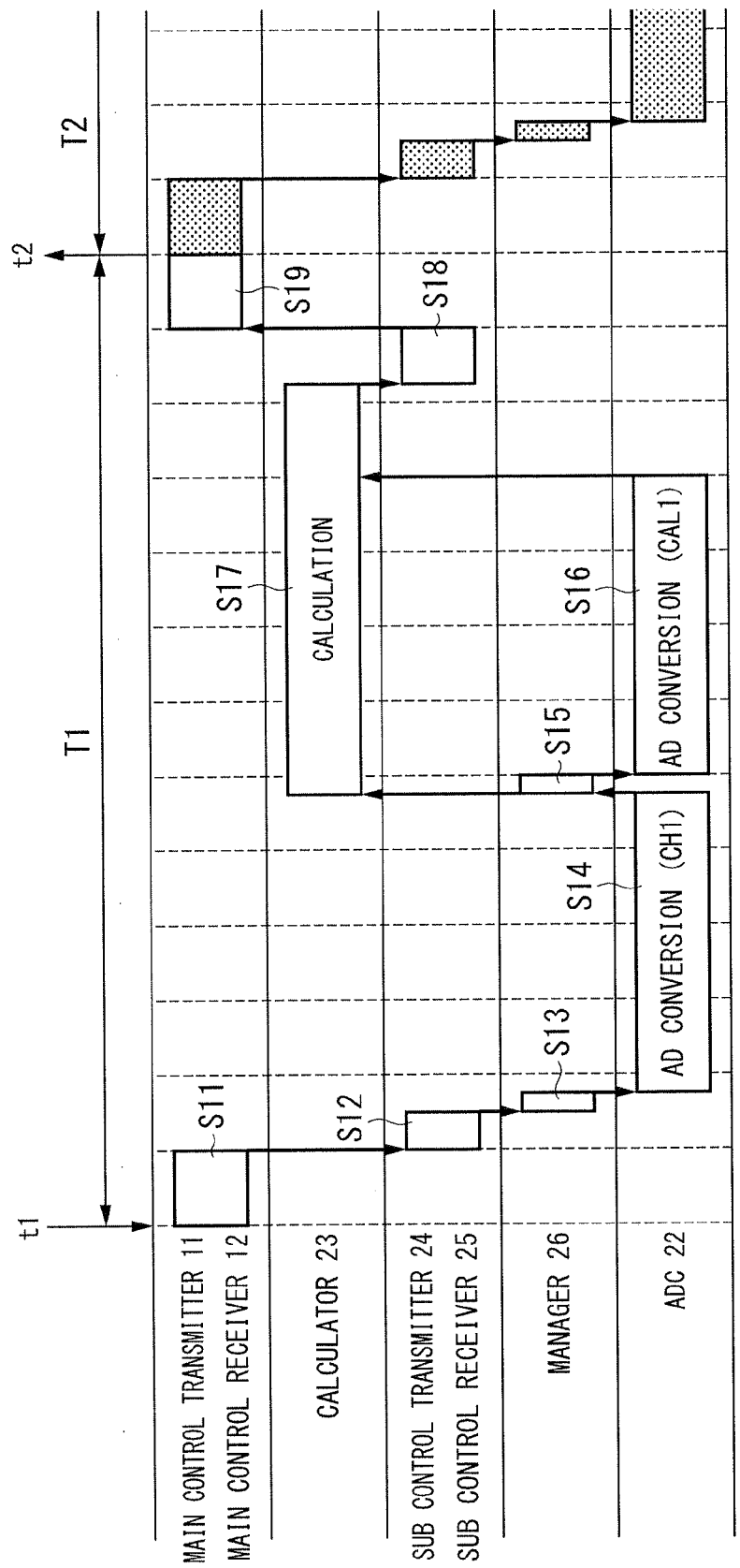
FIG. 2 is a timing chart illustrating the operations of the measurement device according to the first embodiment of the present invention.

Next, the operations of the measurement device 1 having the above-described configuration will be described. FIG. 2 is a timing chart illustrating the operations of the measurement device according to the first embodiment of the present invention. In FIG. 2, a time t1 indicates a starting time of a measurement cycle T1 and a time t2 indicates an ending time of the measurement cycle T1. It can be said that the time t2 indicates a starting time of a measurement cycle T2. Each of the measurement cycles T1, T2, . . . is a period of time from when the main controller 10 transmits the control signal C to the sub controller 20 to when the main controller 10 obtains the measured value M1 from the sub controller 20.

A description will be provided for the case in which, first, the main control transmitter 11 provided in the main controller 10 transmits the control signal C1, which designates both the measured signal S1 and the internal calibration signal Q1, at the time t1 (step S11). The control signal C is received by the sub control receiver 25 provided in the sub controller 20 (step S12). The control signal C received by the sub control receiver 25 is output to the manager 26.

Next, the manager 26 controls the multiplexer 21 and the ADC 22. Thereby, a process for selecting the measured signal S1 designated by the control signal C and for converting the selected measured signal S1 into a digital signal is performed (step S13). In other words, the control (first control) of the above-described (1) is performed. Thereby, the ADC 22 performs the conversion process of the measured signal S1 (measured signal CH1) into a digital signal (step S14).

After the conversion process of the measured signal S1 into a digital signal is completed, the ADC 22 outputs the converted digital signal to the calculator 23 and the ADC 22 outputs a conversion completion signal to the manager 26. Next, the manager 26 controls the multiplexer 21, the ADC 22, and the calculator 23 to perform a process for selecting the internal calibration signal Q1 designated by the control signal C and for converting the selected internal calibration signal Q1 into a digital signal and a process for calculating the measured value M1 (step S15). In other words, the control (second control) of the above-described (2) is performed. Thereby, a conversion process of the internal calibration signal Q1 (internal calibration signal CAL1) into a digital signal (step S16) and a calculation process of the measured value M1 (step S17) are performed in parallel by the ADC 22 and the calculator 23.

The calculator 23 performs the calculation process of the measured value M1 using a latest digital signal output from the ADC 22 and a digital signal stored in a memory (not shown) provided in the calculator 23. In particular, the measured value M1 is calculated using the measure signal S1, which has been converted into the digital signal in the step S14, and the latest internal calibration signal of the internal calibration signals Q1 and Q2, which have been converted into the digital signal before the time t1.

After the conversion process of the internal calibration signal Q1 into the digital signal (the process of step S16) is completed, the converted digital signal is output from the ADC 22 to the calculator 23 and stored into the memory (not shown) provided in the calculator 23 and the conversion completion signal is output from the ADC 22 to the manager 26. The digital signal stored in the above-described memory is used to calculate a measured value M1 in a later measurement cycle than the measurement cycle T1 shown in FIG. 2. The details will be described later.

After the calculation of the measured value M1 by the calculator 23 is completed, the sub control transmitter 24 transmits the measured value M1 calculated by the calculator 23 to the main controller 10 (step S18). When the main control receiver 12 provided in the main controller 10 receives the measured value M1, the measurement cycle T1 is finished.

At the same time as the completion of the measurement cycle T1 shown in FIG. 2, the next measurement cycle T2 is started. For example, the main controller 10 transmits a control signal C1, which designates both the measured signal S1 and the internal calibration signal Q2, to the sub controller 20, and the similar processes to those in the measurement cycle T1 are performed. After that, the main controller 10 alternately transmits a control signal C1 designating both the measured signal S1 and the internal calibration signal Q1 and a control signal C1 designating both the measured signal S1 and the internal calibration signal Q2 to the sub controller 20 at each measurement cycle. Thereby the measurement of the measured value M1 is performed at each measurement cycle.

Figure 3:
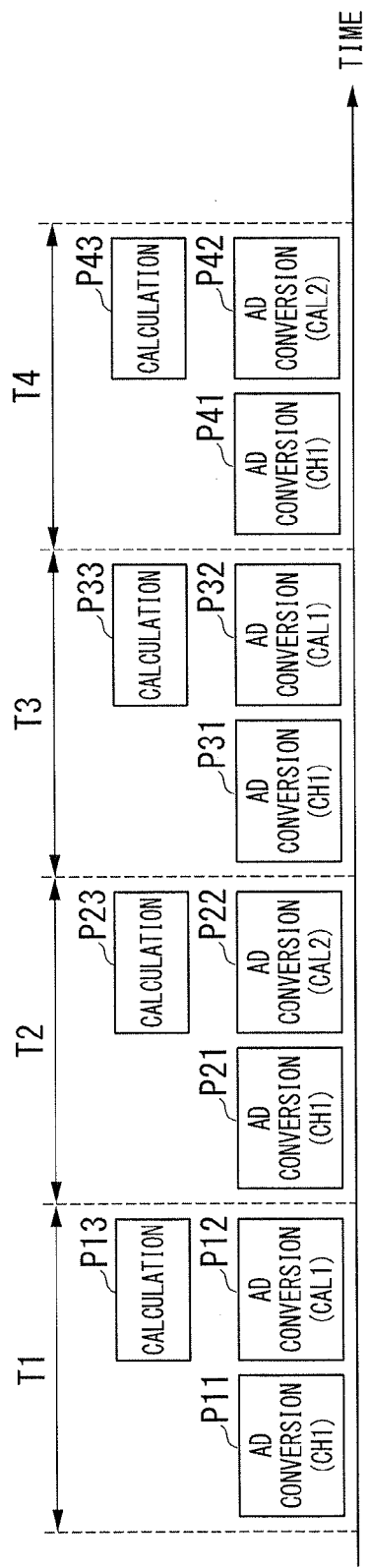
FIG. 3 is a diagram summarizing processes performed by the measurement device according to the first embodiment of the present invention.

FIG. 3 is a diagram summarizing processes performed by the measurement device according to the first embodiment of the present invention. As shown in FIG. 3, in a measurement cycle T1, a process P11 for converting a measured signal CH1 (measured signal S1) into a digital signal, a process P12 for converting an internal calibration signal CAL1 (internal calibration signal Q1) into a digital signal, and a process P13 for calculating a measured value M1 are performed. In a measurement cycle T2, a process P21 for converting a measured signal CH1 (measured signal S1) into a digital signal, a process P22 for converting an internal calibration signal CAL2 (internal calibration signal Q2) into a digital signal, and a process P23 for calculating a measured value M1 are performed. In a measurement cycle T3, processes P31 to P33, which are similar to the processes P11 to P13 in the measurement cycle T1, respectively, are performed. In a measurement cycle T4, processes P41 to P43, which are similar to the process P21 to P23 in the measurement cycle T2, respectively, are performed.

Regarding the measurement cycle T3, the process P32 is not completed and the internal calibration signal CAL1 is not converted into a digital signal at the time when the process P33 for calculating the measured value M1 is started. Therefore, the calculator 23 for performing the process P33 calculates the measured value M1 using the measured signal CH1 which has been converted into a digital signal in the process P31 in the measurement cycle T3, the internal calibration signal CAL2 which has been converted into a digital signal in the process P22 in the measurement cycle T2, and the internal calibration signal CAL1 which has been converted into a digital signal in the process P12 in the measurement cycle T1.

Similarly, regarding the measurement cycle T4, the process P42 is not completed and the internal calibration signal CAL2 is not converted into a digital signal at the time when the process P43 for calculating the measured value M1 is started. Therefore, the calculator 23 for performing the process P43 calculates the measured value M1 using the measured signal CH1 which has been converted into a digital signal in the process P41 in the measurement cycle T4, the internal calibration signal CAL1 which has been converted into a digital signal in the process P32 in the measurement cycle T3, and the internal calibration signal CAL2 which has been converted into a digital signal in the process P22 in the measurement cycle T2.

As described above, in the first embodiment, the measured value M is calculated using the measured signal CH1 which has been converted into a digital signal in a measurement cycle in which the calculation by the calculator 23 is performed (for example, the measurement cycle T3 in which the process P33 is performed), and the internal calibration signals CAL1 and CAL2, each of which has been converted into a digital signal in the previous measurement cycle (for example, the measurement cycles T1 and T2). Therefore, even if the process for converting the internal calibration signal into a digital signal and the process for calculating the measured value M1 are performed in parallel, the measured value M1 can be calculated.

As described above, in the first embodiment, the main controller 10 transmits the control signal C, which designates both the measurement signal S1 and the internal calibration signal (one of the internal calibration signals Q1 and Q2) to be converted into a digital signal, to the sub controller 20, and the sub controller 20 calculates the measured value M1 by performing the control indicated by the above-described (1) and then performing the control indicated by the above-described (2) based on the control signal C. Thereby, since the process for converting the internal calibration signal into a digital signal and the process for calculating the measured value M1 can be performed in parallel and the number of communications between the main controller 10 and the sub controller 20 can be reduced, the measurement cycle can be shortened.

Second Embodiment

Figure 4:
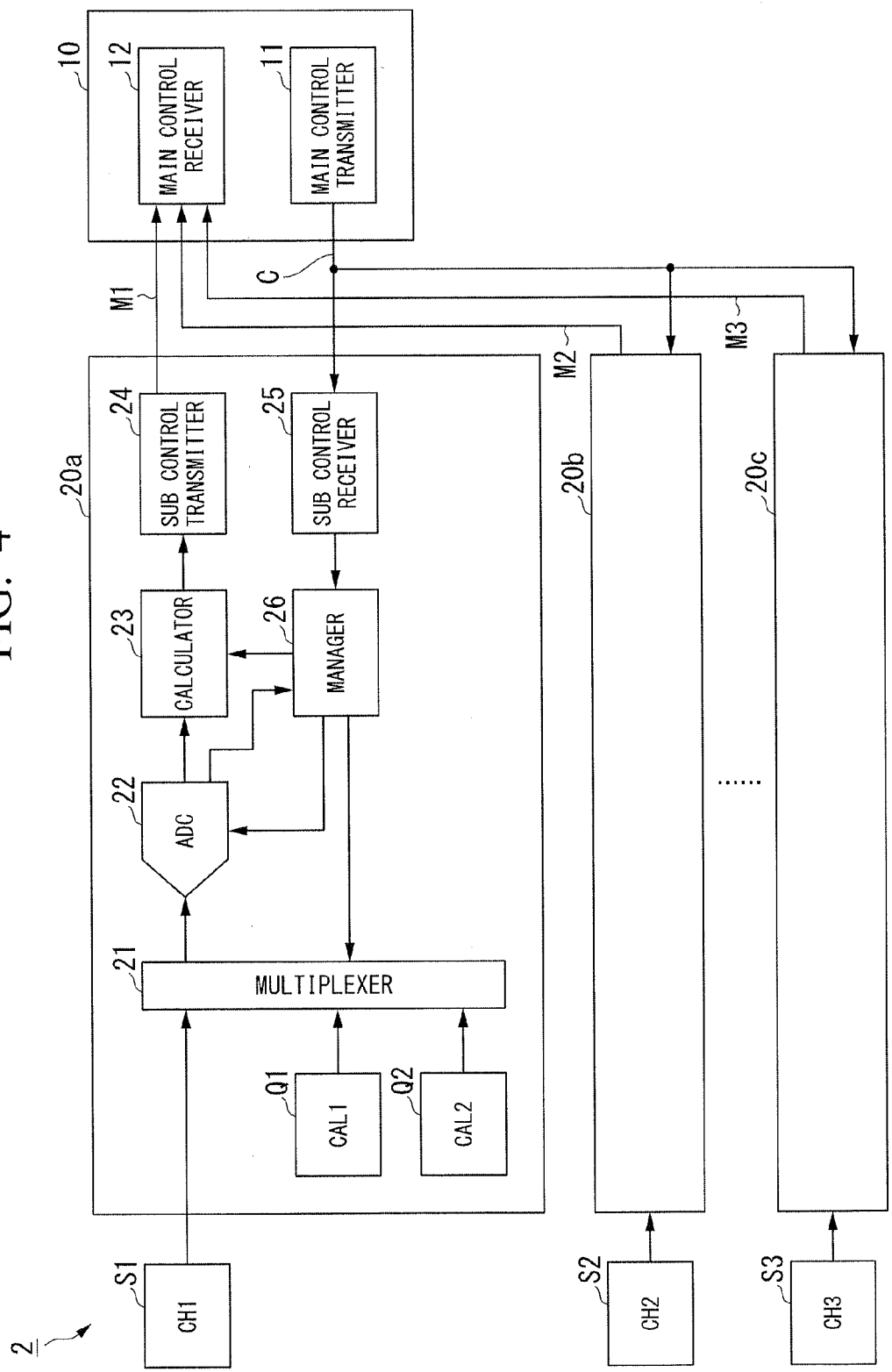
FIG. 4 is a block diagram showing the main parts of the configuration of a measurement device according to a second embodiment of the present invention.

FIG. 4 is a block diagram showing the main parts of the configuration of a measurement device according to a second embodiment of the present invention. In FIG. 4, blocks which correspond to those in FIG. 1 are assigned the same reference numerals. As shown in FIG. 4, a measurement device 2 according to the second embodiment includes a main controller 10 and a plurality of sub controllers 20a to 20c. The measurement device 2 is configured to calculate each of measured values M1 to M3 using a plurality of measured signals S1 to S3 (for example, measured signals S1 to S3 having a different channel from each other) input from the outside of the measurement device 2.

Each of the plurality of sub controllers 20a to 20c has a similar configuration to that of the sub controller 20 shown in FIG. 1. A sub control receiver 25 provided in each of the plurality of sub controllers 20a to 20c is connected to a main control transmitter 11 provided in the main controller 10. Therefore, by simply making the main control transmitter 11 send a control signal C once, the control signal C can be simultaneously transmitted to the plurality of sub controllers 20a to 20c (broadcast transmission). Thereby, even if the plurality of sub controllers 20a to 20c are provided in the measurement device 2, the number of communications of the control signal C is not increased. The main controller 10 is required to sequentially receive the measured values M1 to M3 respectively transmitted from the plurality of sub controllers 20a to 20c.

The measurement device 2 is basically similar to that of the first embodiment except that the measurement device 2 includes the plurality of sub controllers 20a to 20c. Therefore, also in the measurement device 2 according to the second embodiment, the main controller 10 transmits the control signal C, which designates both the measurement signal (measurement signals S1 to S3) and the internal calibration signal (one of the internal calibration signals Q1 and Q2) to be converted into a digital signal, to each of the sub controllers 20a to 20c, and each of the sub controllers 20a to 20c calculates the measured value M1 by performing the control indicated by the above-described (1) and then performing the control indicated by the above-described (2). Thereby, also in the second embodiment, the measurement cycle can be shortened.

Although the foregoing has been a description of the measurement devices according to the embodiments of the present invention, the present invention is not limited to the embodiments described above, and can be freely modified within the scope of the present invention. For example, although, in the above-described embodiments, the example where the two internal calibration signals Q1 and Q2 are prepared in the sub controller 20, the number of the internal calibration signal may be one or be equal to or greater than three.

What is claimed is:

1. A measurement device comprising:
    a first controller configured to output a control signal, the control signal designating both an input signal and a calibration signal to be converted into a digital input signal and a digital calibration signal, respectively, the input signal being input from an outside of the measurement device, the calibration signal being previously prepared; and
    a second controller configured to perform a first control and then to perform a second control based on the control signal output from the first controller, the first control being for selecting the input signal and converting the selected input signal into the digital input signal, the second control being for selecting the calibration signal and converting the selected calibration signal into the digital calibration signal and for calculating a measured value using the digital input signal converted by the first control and another digital calibration signal converted by a control performed before the first control,
    wherein the second controller is configured to perform the conversion of the calibration signal into the digital calibration signal and the calculation of the measured value in parallel.

2. The measurement device according to claim 1, wherein a plurality of calibration signals is previously prepared, and
    the control signal output from the first controller designates both the input signal and one of the plurality of calibration signals.

3. The measurement device according to claim 2, wherein the second controller comprises:
    a selector configured to select the input signal and one of the calibration signals;
    a converter configured to convert the input signal and the one of the calibration signals selected by the selector into the digital input signal and the digital calibration signal, respectively;
    a calculator configured to calculate the measured value using the digital input signal and the digital calibration signal converted by the converter; and
    a manager configured to control the selector and the converter to perform the first control and to control the selector, the converter, and the calculator to perform the second control based on the control signal output from the first controller.

4. The measurement device according to claim 3, wherein the calculator is configured to transitorily memorize the digital calibration signal converted by the second control and to use the memorized digital calibration signal in a control after the second control.

5. The measurement device according to claim 3, wherein the second controller further comprises a first storage storing the calibration signal.

6. The measurement device according to claim 3, wherein the second controller further comprises a transmitter configured to transmit the measured value calculated by the calculator to the first controller.

7. The measurement device according to claim 3, wherein the converter is configured to output a conversion completion signal to the manager each time the converter converts the signal selected by the selector into the digital signal.

8. The measurement device according to claim 3, wherein the calculator further comprises a second storage storing the digital calibration signal converted by the converter.

9. The measurement device according to claim 8, wherein the calculator is configured to calculate the measured value using a latest digital input signal output from the converter and the digital calibration signal stored in the second storage.

10. The measurement device according to claim 8, wherein the calculator is configured to calculate the measured value using a latest digital input signal output from the converter and a latest digital calibration signal among digital calibration signals stored in the second storage.

11. The measurement device according to claim 3, wherein the second controller further comprises a receiver configured to receive the control signal output from the first controller.

12. The measurement device according to claim 11, wherein the receiver is configured to output, to the manager, the control signal received from the first controller.

13. The measurement device according to claim 1, wherein the measurement device comprises a plurality of second controllers, and
    the first controller is configured to simultaneously output the control signal to the plurality of second controllers.

14. The measurement device according to claim 13, wherein each of the plurality of second controllers is configured to perform the first control and then to perform the second control based on the control signal simultaneously output from the first controller to each of the second controllers.

15. A measurement device comprising:
    a first controller configured to output a control signal, the control signal designating both an input signal and a calibration signal to be converted into a digital input signal and a digital calibration signal, respectively, the input signal being input from an outside of the measurement device, the calibration signal being previously prepared; and
    a second controller configured to perform a first control and then to perform a second control based on the control signal output from the first controller, the first control being for selecting the input signal and converting the selected input signal into the digital input signal, the second control being for selecting the calibration signal and converting the selected calibration signal into the digital calibration signal and for calculating a measured value using the digital input signal converted by the first control and another digital calibration signal converted by a control performed before the first control,
    wherein a plurality of calibration signals is previously prepared,
    the control signal output from the first controller designates both the input signal and one of the plurality of calibration signals,
    the second controller comprises:
        a selector configured to select the input signal and one of the calibration signals;

a converter configured to convert the input signal and the one of the calibration signals selected by the selector into the digital input signal and the digital calibration signal, respectively;

a calculator configured to calculate the measured value using the digital input signal and the digital calibration signal converted by the converter; and a manager configured to control the selector and the converter to perform the first control and to control the selector, the converter, and the calculator to perform the second control based on the control signal output from the first controller, and the converter is configured to output a conversion completion signal to the manager each time the converter converts the signal selected by the selector into the digital signal.

16. A measurement device comprising:

a first controller configured to output a control signal, the control signal designating both an input signal and a calibration signal to be converted into a digital input signal and a digital calibration signal, respectively, the input signal being input from an outside of the measurement device, the calibration signal being previously prepared; and a second controller configured to perform a first control and then to perform a second control based on the control signal output from the first controller, the first control being for selecting the input signal and converting the selected input signal into the digital input signal, the second control being for selecting the calibration signal and converting the selected calibration signal into the digital calibration signal and for calculating a measured value using the digital input signal converted by the first control and another digital calibration signal converted by a control performed before the first control, wherein a plurality of calibration signals is previously prepared, the control signal output from the first controller designates both the input signal and one of the plurality of calibration signals, the second controller comprises:

a selector configured to select the input signal and one of the calibration signals;

a converter configured to convert the input signal and the one of the calibration signals selected by the selector into the digital input signal and the digital calibration signal, respectively;

a calculator configured to calculate the measured value using the digital input signal and the digital calibration signal converted by the converter; and a manager configured to control the selector and the converter to perform the first control and to control the selector, the converter, and the calculator to perform the second control based on the control signal output from the first controller, the second controller further comprises a receiver configured to receive the control signal output from the first controller, and the receiver is configured to output, to the manager, the control signal received from the first controller.

* * * * *